(12) United States Patent
Lichtenegger et al.

(10) Patent No.: US 7,250,590 B2
(45) Date of Patent: Jul. 31, 2007

(54) OPTOELECTRONIC ARRANGEMENT AND A METHOD FOR CONTROLLING THE OUTPUT POWER OF A TRANSMISSION COMPONENT

(75) Inventors: Thomas Lichtenegger, Alteglofsheim (DE); Hans Hurt, Regensburg (DE); Stephan Prucker, Burglengenfeld (DE)

(73) Assignee: Infineon Technologies Fiber Optics GmbH, Berlin (DE)

( * ) Notice: Subject to any disclaimer, the term of this patent is extended or adjusted under 35 U.S.C. 154(b) by 150 days.

(21) Appl. No.: 10/892,777

(22) Filed: Jul. 16, 2004

(65) Prior Publication Data

US 2006/0011814 A1 Jan. 19, 2006

(51) Int. Cl.
*G02B 6/36* (2006.01)
(52) U.S. Cl. .......................... 250/205; 385/94
(58) Field of Classification Search ............ 250/214 R, 250/205, 239, 227.25, 214.1, 573–577; 385/94
See application file for complete search history.

(56) References Cited

U.S. PATENT DOCUMENTS 5,812,582 A * 9/1998 Gilliland .................. 372/50.21
6,527,460 B2 * 3/2003 Cohen .......................... 385/94
2003/0193016 A1 * 10/2003 Chin ....................... 250/231.13

* cited by examiner

*Primary Examiner*—Thanh X. Luu
*Assistant Examiner*—Tony Ko
(74) *Attorney, Agent, or Firm*—Eschweiler & Associates, LLC

(57) ABSTRACT

The invention relates to an optoelectronic arrangement which has a transmission component which emits electromagnetic radiation, a receiving component which detects a portion of the radiation emitted from the transmission component, and a transparent material which at least partially surrounds the transmission component and the receiving component and provides a boundary surface between the arrangement and the environment. In this case, a portion of the light which is emitted from the transmission component is reflected in the transparent material and/or on the boundary surface of the transparent material, and is detected by the receiving component. The invention also relates to a method for controlling the output power of a transmission component by means of a receiving component which detects a portion of the radiation which is emitted from the transmission component.

11 Claims, 2 Drawing Sheets

OPTOELECTRONIC ARRANGEMENT AND A METHOD FOR CONTROLLING THE OUTPUT POWER OF A TRANSMISSION COMPONENT

FIELD OF THE INVENTION

The invention relates to an optoelectronic arrangement and to a method for controlling the output power of a transmission component.

BACKGROUND TO THE INVENTION

It is known that the output power of optical transmission components such as light emitting diodes (LEDs) or laser diodes can be changed by environmental influences such as temperature and aging effects. However, it is generally desirable to keep the output power of a transmission component as constant as possible, in order to make it possible to comply with predetermined specification limits.

For this purpose, it is known for the driver current through a transmission component to be influenced by variation of an external resistance which is arranged outside the transmission component. The driver current is in this case adjusted by means of the resistance such that the output power of a transmission component is kept as constant as possible. However, a design such as this allows stabilization of the light power only for tightly specified transmission components with a narrow light power distribution, stable aging and a very stable temperature response.

DE 198 38 350 A1 discloses an optical transmission device in which an optical transmitter emits radiation vertically. A reflection surface reflects a portion of the emitted radiation onto an optically sensitive receiving area of a monitor receiver, which is arranged on one side of the transmitter. An intermediate body with a reflective circumferential surface is in this case arranged between the reflection surface and the receiving zone. This design has the disadvantage that it is relatively complex, since a separate intermediate body is required.

WO 03/027743 A1 discloses a transmission and/or receiving arrangement for optical signal transmission, in which a baseplate, a transmission and/or receiving element and a beamforming element are arranged one above the other in such a way that an intermediate space is created between the baseplate and the beamforming element, in which the transmission and/or receiving element is located. One refinement provides for a monitor diode to be arranged under or alongside the transmission and/or receiving element. A portion of the light is reflected back onto the monitor diode via an inclined boundary surface in the beam path.

There is a requirement for optoelectronic arrangements having a transmission component and a receiving component, which allow the receiving component to detect a portion of the light emitted from the transmission component, in a simple manner.

SUMMARY OF THE INVENTION

The present invention provides an optoelectronic arrangement which has: a transmission component which emits electromagnetic radiation, a receiving component which detects a portion of the radiation emitted from the transmission component, and a transparent material which at least partially surrounds the transmission component and the receiving component and which provides a boundary surface between the arrangement and the environment.

In this case, a portion of the light which is emitted from the transmission component is reflected in the transparent material and/or on the boundary surface of the transparent material, and is detected by the receiving component. The light thus first of all propagates from the transmission component in the transparent material, and is then partially reflected on a boundary surface of the transparent material. Depending on the homogeneity of the transparent material, small radiation components may also be scattered or reflected even within the transparent material, that is to say even before they reach the boundary surface, in the direction of the receiving component. This scattering becomes greater the greater the inhomogeneities of the transparent material on which the emitted light can be scattered.

If the transparent material is adjacent to a material with the same refractive index during operation of the arrangement, so that there is no backward reflection, or virtually no backward reflection, on the boundary surface, it is also possible for the light which is detected by the receiving component to be produced solely by radiation components which have been scattered within the material by scattering in the direction of the receiving component.

The majority of the light passes through the boundary surface and is injected into an optical waveguide, for example for data transmission purposes.

The present invention is based on the idea of using the back reflection in the transparent material, in particular caused by reflection on a boundary surface of the transparent material, to deduce the emitted light power from the transmission component. The back reflection in this case relates to the receiving component, and produces a photocurrent which is directly proportional to the light power emitted from the transmission component. The photocurrent may be used, for example, by a connected integrated circuit to control the driver current for the transmission component.

The present invention allows the optical output power of a transmitter component to be specified within narrow limits. In addition, transmission sources with very broad specification limits may be used. Furthermore, the invention allows optical transmission components to be used even in severe environmental conditions, for example at high temperatures.

The invention can be implemented at low cost since the reflection in and on the boundary surface of the transparent material, which is provided in any case, is used in a simple manner to monitor the light power of the transmission component. There is no need to provide separate reflective structures in the beam path.

In one preferred refinement, the transparent material forms a housing (package) for the arrangement. The light which is emitted from the transmission component is in this case partially reflected at the boundary surface between the housing and the environment, in particular on an upper planar housing boundary, from which the majority of the emitted light emerges.

The transmission component is preferably arranged on the receiving component. In this case, it covers at most a portion of the photosensitive area of the receiving component. Both the transmission component and the receiving component are in this case preferably in the form of a prefabricated chip, thus resulting in a chip-on-chip design. The transmission component chip is in this case smaller than the receiving component chip. The entire arrangement is preferably arranged on a lead frame, which is preferably likewise encased by the transparent material, with the lead frame legs projecting out of the transparent material.

In a first refinement, the receiving component is a monitor diode, which is used exclusively to detect a portion of the radiation which is emitted from the transmission component. The receiving component thus carries out a monitoring function on its own.

In a second refinement, the receiving component is a photodiode, which, in the case of bidirectional data transmission using the half-duplex method, is used as a monitor diode during transmission, and is used as a receiving photodiode during reception. The existing photodiode is thus used in an effective manner for two purposes. During transmission from the transmission component, it is used to monitor the emitted light power. During reception, that is to say during the detection of signals which have been transmitted from another transmission component and have been transmitted to the arrangement, it is used for signal detection. The associated electronics for the arrangement are designed in a corresponding manner, that is to say they evaluate the signal from the photodiode differently depending on whether transmission or reception is taking place. The corresponding time slots must be defined.

The transparent material is preferably a transparent encapsulation material or transparent stamped material composed of plastic. It is cast or stamped as a sheath around the components of the arrangement, in order to protect them against environmental influences.

A transparent material is a material which is in all cases transparent for the wavelength emitted from the transmission component.

The invention also relates to a method for controlling the output power of a transmission component by means of a receiving component which detects a portion of the radiation which is emitted from the transmission component. The method has the following steps:
  the transmission component and the receiving component are at least partially arranged in a transparent material,
  the receiving component detects radiation which is emitted from the transmission component and is reflected in the transparent material and/or on the boundary surface of the transparent material,
  the light power of the transmission component is determined from the detection signal of the receiving component; and
  the driver current to the transmission component is increased or reduced until the instantaneous light power of the transmission component corresponds to a nominal light power for the transmission component.

The radiation which is reflected in the transparent material and on the boundary surface is converted in the receiving component to a detection signal, the photocurrent. The light power from the transmission component is then stabilized on the basis of the signal detected by the receiving component. This can be done because the detection signal (the photocurrent) from the receiving component is directly proportional to the light power emitted from the transmission component.

In one preferred refinement, the method is used in the course of bidirectional data transmission using the half-duplex method, and with the receiving component being used as a monitor diode during transmission and as a receiving photodiode during reception.

BRIEF DESCRIPTION OF THE DRAWINGS

The invention will be explained in more detail in the following text using an exemplary embodiment and with reference to the figures, in which.

DESCRIPTION OF ONE PREFERRED EXEMPLARY EMBODIMENT

Figure 1:
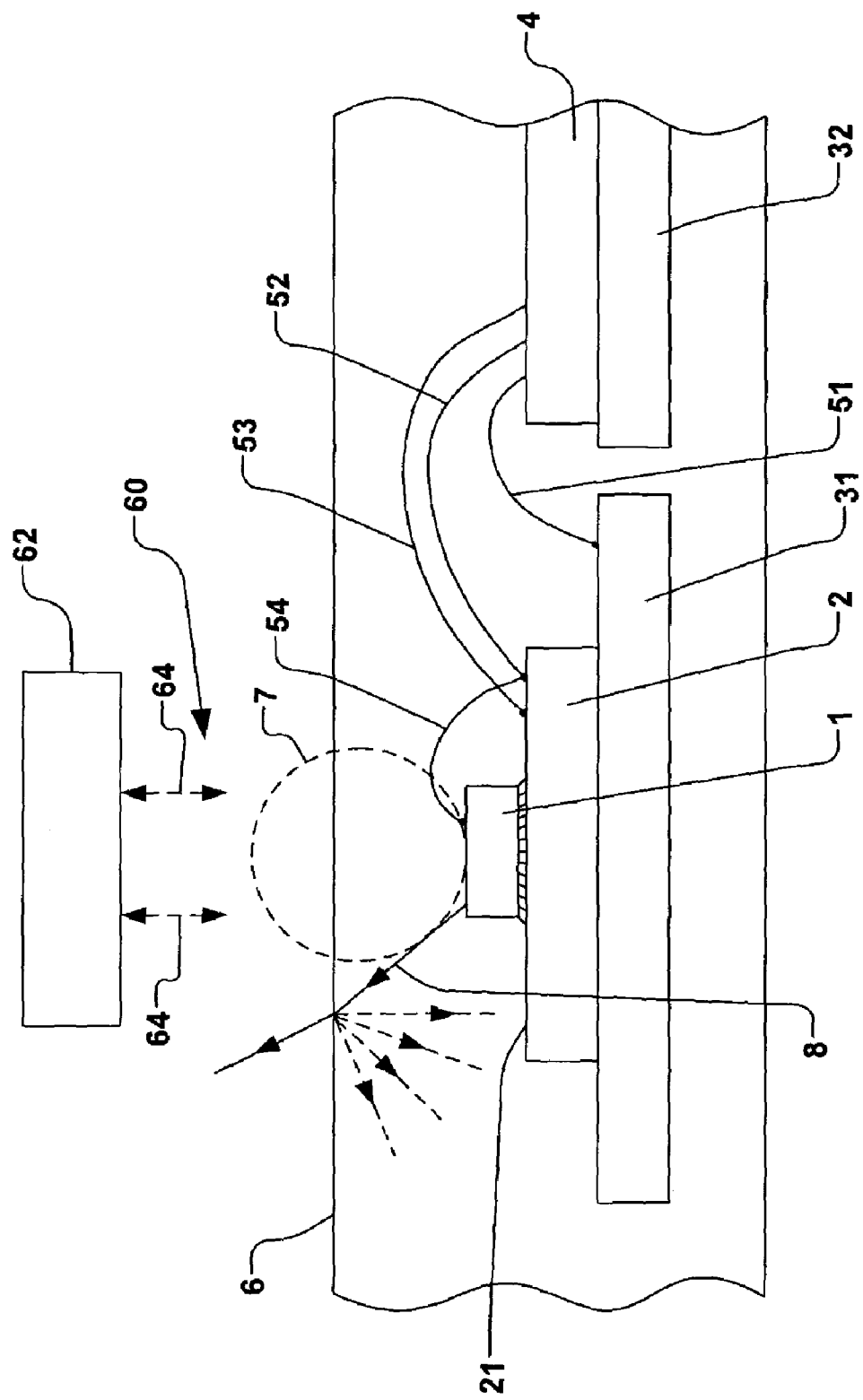
FIG. 1 shows an optoelectronic arrangement with a transmission component and a receiving component, which are arranged in a housing composed of a transparent encapsulation material.

FIG. 1 shows a transmission component 1 which is arranged on the receiving component 2. The transmission component 1 in the illustrated exemplary embodiment is a light emitting diode (LED). However, it may likewise also be a laser diode, for example a vertically emitting laser or an edge emitter.

The receiving component 2 is a photodiode which has an optically sensitive receiving area 21 for detection of electromagnetic radiation.

The transmission component 1 is formed in the same way as the receiving component 2, as a prefabricated chip. The LED chip 1 is in this case arranged on the photodiode chip 2 within a chip-on-chip design. The LED chip 1 in this case covers at most a portion of the optically sensitive receiving area 21 of the photodiode chip 2.

FIG. 1 also shows a leadframe 31, on which the photodiode 2 is arranged, as well as an integrated circuit 4, which is arranged on a further lead frame 32.

The LED chip 1 and the photodiode chip 2 are contacted in a manner known per se by means of bonding wires 51 to 54. Contact is in each case made from the upper face and lower face of the chips 1, 2. The bonding wires 51 to 53 are in this case connected to the circuit 4, and transmit the drive signal for the LED chip 1 as well as the current signal that is produced by the photodiode chip 2. In particular, the transmission component 1 is supplied with a specific driver current, which governs the light power from the transmission component 1, by means of a driver which is integrated in the circuit 4. In this context, it should be mentioned that the driver module for the transmission component need not necessarily be integrated in the integrated circuit 4, and may also be in the form of a separate component.

The entire arrangement, in particular the transmission component 1 and the receiving component 2, is surrounded by a transparent encapsulation or stamped material, which provides a housing for the arrangement. The encapsulation or stamped material forms a boundary surface 6 to the environment, and is preferably planar.

The transmission component 1 has a specific emission characteristic 7. An LED diode in this case represents a flat radiating element with Lambert radiation. The light which is emitted from the transmission component 1 is partially scattered and reflected back on the boundary surface 6, as is illustrated schematically in FIG. 1 on the basis of an example of a light beam 8. The back reflection on the boundary surface 6 is produced by a sudden change in the refractive index at the boundary surface 6. Small radiation components may also be reflected on inhomogeneities within the package, on the way to the boundary surface 6. Scattering can also take place on inhomogeneities which occur at the boundary surface 6 and are caused, for example, by roughness of the boundary surface 6.

The expression "reflection" is used as being representative of all mechanisms which lead to the emitted light being reflected or scattered onto the photodiode 2.

The light reflected back is detected by the photodiode 2. The photocurrent measured in this case is directly proportional to the light power emitted from the transmission component 1. Consequently, the instantaneous light power from the transmission component can be deduced in a simple manner from the photocurrent. For example, this instantaneous light power is then compared in the circuit 4 with a nominal light power, and the driver current is raised or lowered until the instantaneous light power corresponds to the nominal light power.

Figure 2:
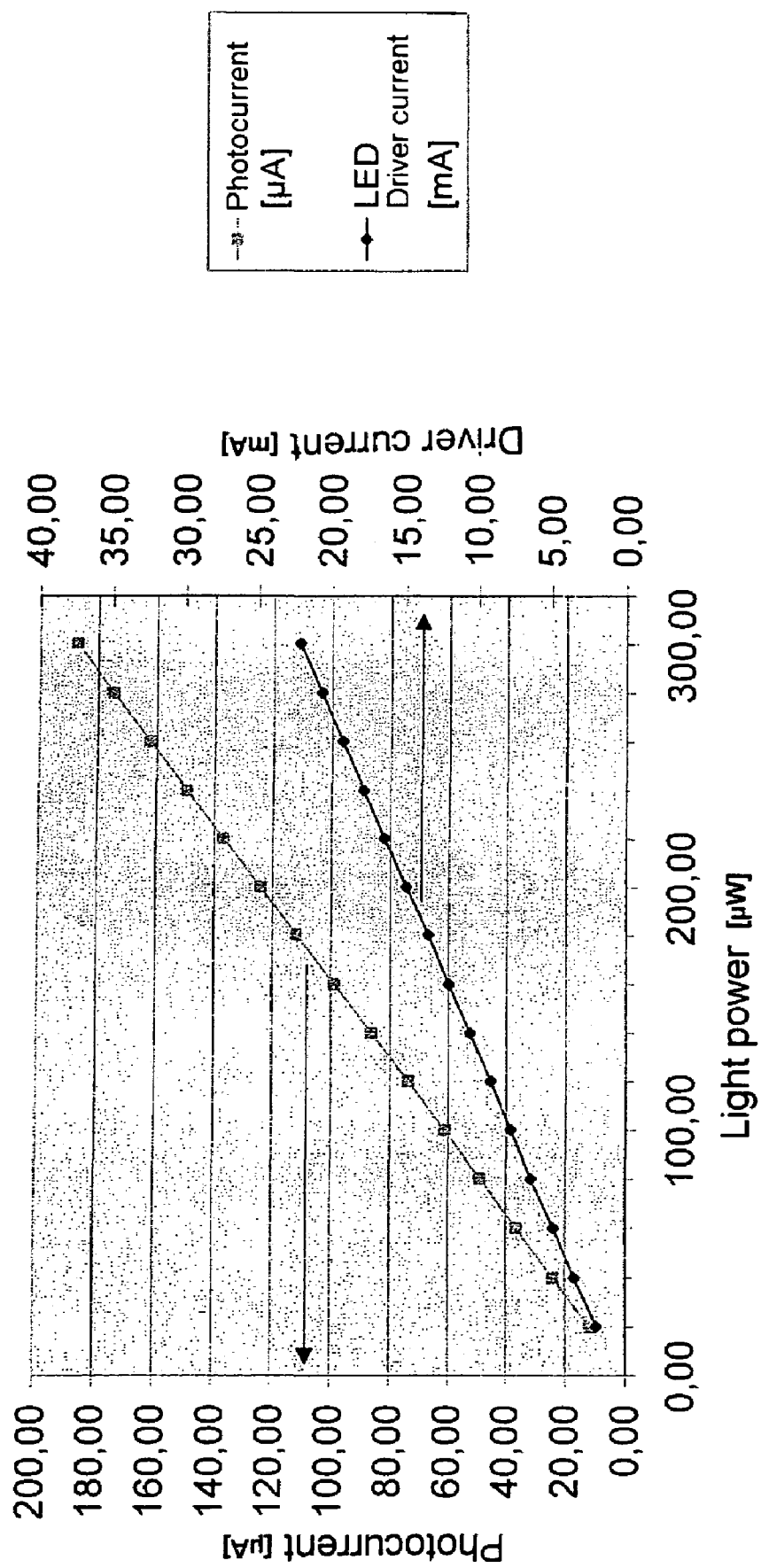
FIG. 2 shows the photocurrent of the receiving component as a function of the light power of the transmission component in the arrangement shown in FIG. 1.

FIG. 2 shows the light power on the x axis and firstly the photocurrent of the photodiode 2 and secondly the driver current through the LED chip 1 on the y axis, based on an example. There is a highly linear relationship between the light power and the measured photocurrent (upper straight line). For example, when the measured photocurrent decreases, this means that the light power of the transmission component has fallen. The driver current is then raised until the nominal light power or a corresponding value of the photocurrent is reached once again.

In order to detect differences in the reflectivity of the surface of the transparent material, which can occur as a result of process fluctuations during manufacture, the upper straight line, which is illustrated in FIG. 2, is preferably calibrated before the transmission component is first used. For this purpose, the light power from the transmission component is detected, for example in the factory, by means other than the photodiode. The photocurrent which is measured in this case represents one point on the straight line. A second point on the straight line is defined by the origin.

In one preferred refinement, the arrangement is used for bidirectional data transmission using the half-duplex method. The photodiode is in this case used as a monitor diode during transmission, and receives a portion of the light which is emitted from the transmission component. During reception, in contrast, the photodiode is used as a pure receiving diode. There is therefore no need to use an additional photodiode.

One preferred application of the invention is in the field of data transmission. In this case, the portion of the emitted radiation which is not reflected is passed to a coupling zone 60, and in which this portion of the radiation is injected into an optical waveguide 62. Furthermore, in the case of bidirectional data transmission 64, light is output from a waveguide such as this. One application example is data transmission in the automobile field based on the byteflight protocol, with data being transmitted via plastic fibers using the half-duplex method. The transmission component is in this case in the form of an LED chip.

In another preferred application, the arrangement according to the invention is used for lighting and back-lighting purposes.

The embodiment of the invention is not restricted to the exemplary embodiments described above. Those skilled in the art will be aware that numerous alternative embodiment variants exist, which make use of the teaching defined in the following claims, despite the fact that they differ from the described exemplary embodiments.

The invention claimed is:

1. An optoelectronic arrangement, comprising:
a transmission component, wherein the transmission component consists of a single light emitting diode or a single laser diode configured to emit electromagnetic radiation for data transmission, wherein the electromagnetic radiation comprises a first portion for data transmission to an optical waveguide through a coupling zone and a second portion;
a receiving component configured to detect the second portion of the radiation emitted from the transmission component; and
a transparent material at least partially surrounding the transmission component and the receiving component and which provides a boundary surface between the optoelectronic arrangement and an environment external thereto,
wherein the transparent material is formed as a transparent encapsulation material;
wherein the second portion of the radiation detected by the receiving component is emitted from the transmission component and reflected in the transparent material or at the boundary surface of the transparent material back to the receiving component.

2. The arrangement according to claim 1, wherein the transparent material forms a housing for the optoelectronic arrangement, and wherein the light which is emitted from the transmission component is partially reflected at the boundary surface of the housing to the environment.

3. The arrangement according to claim 1, wherein the transmission component is arranged on the receiving component and covers at most a portion of the photosensitive area of the receiving component.

4. The arrangement according to claim 3, wherein the receiving component is arranged on a leadframe.

5. The arrangement according to claim 1, wherein the transmission component comprises a prefabricated chip.

6. The arrangement according to claim 1, wherein the receiving component comprises a prefabricated chip.

7. The arrangement according to claim 1, wherein the receiving component comprises a monitor diode configured to detect exclusively the second portion of the radiation which is emitted from the transmission component.

8. An optoelectronic arrangement, comprising:
a transmission component configured to emit electromagnetic radiation;
a receiving component configured to detect a portion of the radiation emitted from the transmission component; and
a transparent material at least partially surrounding the transmission component and the receiving component and which provides a boundary surface between the optoelectronic arrangement and an environment external thereto,
wherein the portion of the radiation detected by the receiving component is emitted from the transmission component and reflected in the transparent material or at the boundary surface of the transparent material back to the receiving component, and wherein the receiving component is configured for bidirectional data transmission using a half-duplex method and comprises a photodiode configured to operate as a monitor diode detecting reflected light during transmission, and as a receiving photodiode during reception.

9. A method for controlling the output power of a transmission component, wherein the transmission component consists of a single light emitting diode or a single laser diode by means of a receiving component which detects a portion of radiation which is emitted from a transmission component, comprising:
at least partially encapsulating the transmission component and the receiving component in a transparent material formed as a transparent encapsulation material;
detecting, with the receiving component, radiation which is emitted from the transmission component for data transmission purposes and which is reflected in the transparent material or at a boundary surface of the transparent material;

determining a light power of the transmission component from the detected radiation of the receiving component; and altering a driver current to the transmission component in response to the determined light power so that an instantaneous light power of the transmission component corresponds to a nominal light power for the transmission component.

10. The method according to claim 9, wherein the method for controlling the output power is used in a unidirectional data transmission, and the receiving component is used exclusively as a monitor diode by detecting the reflected radiation.

11. A method for controlling the output power of a transmission component in a bidirectional data transmission using a half-duplex method by means of a receiving component which detects a portion of radiation which is emitted from a transmission component, comprising:

at least partially arranging the transmission component and the receiving component in a transparent material;

detecting, with the receiving component, radiation which is emitted from the transmission component for data transmission purposes and which is reflected in the transparent material or at a boundary surface of the transparent material;

determining a light power of the transmission component from the detected radiation of the receiving component; and altering a driver current to the transmission component in response to the determined light power so that an instantaneous light power of the transmission component corresponds to a nominal light power for the transmission component, and wherein the receiving component is used as a monitor diode by detecting the reflected radiation during a transmission mode, and is used as a receiving photodiode during a reception mode.

* * * * *